United States Patent
O'Meara et al.

(10) Patent No.: US 7,509,962 B2
(45) Date of Patent: Mar. 31, 2009

(54) METHOD AND CONTROL SYSTEM FOR TREATING A HAFNIUM-BASED DIELECTRIC PROCESSING SYSTEM

(75) Inventors: David L. O'Meara, Poughkeepsie, NY (US); Shingo Maku, Kai (JP)

(73) Assignee: Tokyo Electron Limited, Tokyo (JP)

( * ) Notice: Subject to any disclaimer, the term of this patent is extended or adjusted under 35 U.S.C. 154(b) by 374 days.

(21) Appl. No.: 11/038,129

(22) Filed: Jan. 21, 2005

(65) Prior Publication Data

US 2006/0162861 A1 Jul. 27, 2006

(51) Int. Cl.
*B08B 6/00* (2006.01)
(52) U.S. Cl. .................. 134/1.1; 134/21; 134/22.1; 216/37; 216/67; 216/75; 438/905
(58) Field of Classification Search .................. 134/1.1, 134/21, 22.1; 216/37, 67, 75; 438/905
See application file for complete search history.

(56) References Cited

U.S. PATENT DOCUMENTS

2004/0011380 A1* 1/2004 Ji et al. ..................... 134/1.1

2004/0129671 A1* 7/2004 Ji et al. ..................... 216/58

FOREIGN PATENT DOCUMENTS

JP 2004-039788 * 2/2004

OTHER PUBLICATIONS

"Silicon Processing For The VLSI ERA", vol. 1, Lattice Press; Sunset Beach, California, 1986'; Wolf et al.; pp. 565-579.*

* cited by examiner

*Primary Examiner*—George A. Goudreau
(74) *Attorney, Agent, or Firm*—Oblon, Spivak, McClelland, Maier & Neustadt, P.C.

(57) ABSTRACT

A method and control system for treating a hafnium-based dielectric processing system in which a system component of the processing system is exposed to a chlorine-containing gas. A residual hafnium by-product remaining in the processing system after a hafnium removal process is reacted with a chlorine-containing etchant derived from the chlorine-containing gas. A chlorinated hafnium product is volatilized for exhaustion from the processing system. The control system can utilize a computer readable medium to introduce a chlorine-containing gas to the processing system, to adjust at least one of a temperature and a pressure in the processing system to produce from the chlorine-containing gas a chlorine-containing etchant for dissolution of a residual hafnium by-product remaining in the processing system after a hafnium silicate, hafnium oxide, or hafnium oxynitride removal process, and to exhaust a chlorinated hafnium product from the processing system.

26 Claims, 5 Drawing Sheets

METHOD AND CONTROL SYSTEM FOR TREATING A HAFNIUM-BASED DIELECTRIC PROCESSING SYSTEM

CROSS REFERENCE TO RELATED APPLICATIONS

This application is related to U.S. application Ser. No. 10/662,522 entitled "FORMATION OF A METAL-CONTAINING FILM BY SEQUENTIAL GAS EXPOSURE IN A BATCH TYPE PROCESSING SYSTEM" filed on Sep. 16, 2003, the entire contents of which are incorporated herein by reference. This application is related to U.S. application Ser. No. 10/673,513 entitled "METHOD FOR MONITORING STATUS OF SYSTEM COMPONENTS" filed on Sep. 30, 2003, the entire contents of which are incorporated herein by reference.

BACKGROUND OF THE INVENTION

1. Field of the Invention

The present invention relates to semiconductor processing, and more particularly, to a process for treating an apparatus such as a furnace used in producing a high-k dielectric metal-containing insulator.

2. Description of the Related Art

High dielectric constant (high-k) materials with low equivalent oxide thickness (EOT) and very low leakage currents are likely to replace silicon dioxide (e.g., $SiO_2$) dielectric layers in the semiconductor industry. High-k metal-oxides can provide the required capacitance at a considerably larger physical thickness than $SiO_2$, thus allowing the reduction of the gate leakage current by suppression of direct tunneling. Binary oxides such as hafnium oxide (e.g., $HfO_2$) and zirconium oxide (e.g., $ZrO_2$), metal-silicates such as hafnium silicate (e.g., $Hf_xSi_yO_z$) and zirconium silicate (e.g., $Zr_xSi_yO_z$), alumina (e.g., $Al_2O_3$), and lanthanide oxides, are promising metal-oxide high-k materials for gate stack applications.

Precise control of the high-k film growth, the evolution of the interface between the silicon and the high-k film, and the thermal stability of the gate stack are key elements in the integration of high-k films into semiconductor applications. More specifically, hafnium silicate (e.g., $Hf_xSi_yO_z$) films are being developed as high-k dielectrics to scale transistor gate performance beyond thin $SiO_2$.

In some cases, multiple film materials are processed in the same thermal chamber or furnace. Dry cleaning of the furnace is required to maintain practical usage of the tool. Various parts of a processing system can include consumable or replaceable system components that can, for example, be fabricated from quartz, silicon, alumina, carbon, or silicon carbide. The consumable nature of the replaceable components requires frequent maintenance of the processing system. Consumable system parts are commonly replaced or cleaned after film accumulation threatens particle problems, for example between incompatible processes scheduled to be run in sequence, or after detrimental processing conditions, or when unsatisfactory processing results are observed. Alternately, consumable system parts can be cleaned or replaced according to a predetermined maintenance schedule that can, for example, be based on the number of operating hours.

Chamber conditioning processes (also referred to as passivation processes) are commonly implemented in semiconductor fabrication to prepare process chambers for optimal performance. For example, chamber conditioning processes may be carried out following chamber cleaning, after an extended chamber idle period, or before a first chamber production process. When used with plasma chambers, chamber conditioning processes typically involve using a "conditioning plasma" in the plasma chamber for a predetermined length of time to prepare or "condition" the chamber for the upcoming performance of a plasma process involving production wafers. The parameters of the conditioning process (e.g., RF power, chamber and substrate temperature, feed gas composition, and pressure) are usually maintained at or near the parameters of the corresponding production process for which the chamber is being conditioned. In this manner, conditioning processes can help ensure that all processes performed in a process chamber produce results within a desired range.

A method of pre-coating the quartz walls with an $SiO_2$ deposition has been utilized previously to reduce the damage to the quartz parts from dry etching and prevent early quartz failure and particle generation. These methods, however, do not provide the requisite degree of cleaning for long term operation of the furnaces and maintenance of a low particulate process in a hafnium oxide, hafnium silicate, or hafnium oxynitride deposition system.

SUMMARY OF THE INVENTION

To restore a furnace of a processing system to near original conditions, dry etching of the processing chamber is typically performed with fluorinated gases, but hafnium fluoride residues have been discovered as a by-product that becomes a source of particles in subsequent processing. Hence, the above-noted measures for chamber passivation and cleaning do not adequately deal with issues associated with the accumulation of hafnium fluoride residues in the processing system.

One object of the present invention is to provide processes to remove by-products of hafnium oxide, hafnium silicate, or hafnium oxynitride restoration processes from the processing system.

Another object of the present invention is to provide processes to clean in particular hafnium fluoride by-product particulates from the processing system.

Still another object of the present invention is to provide a technique for removing the hafnium fluoride by-product accumulation while pre-coating the processing system walls for further processing.

Various of these and other objects are provided for in different embodiments of the present invention. For instance, the present invention provides a method and control system for treating a hafnium-based dielectric processing system in which a system component of the processing system is exposed to a chlorine-containing gas. A residual hafnium by-product remaining in the processing system, for example after a hafnium oxide, hafnium silicate, or hafnium oxynitride removal process, is reacted with a chlorine-containing etchant derived from the chlorine-containing gas, and a chlorinated hafnium product is volatilized for exhaustion from the processing system.

In one embodiment of the present invention, the control system for treating the processing system can utilize a computer readable medium to introduce a chlorine-containing gas to the processing system, to adjust at least one of a temperature and a pressure in the processing system to produce from the chlorine-containing gas a chlorine-containing etchant for dissolution of a residual hafnium by-product remaining in the processing system after a hafnium removal process, and to exhaust a chlorinated hafnium product from the processing system.

It is to be understood that both the foregoing general description of the invention and the following detailed description are exemplary, but are not restrictive of the invention.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Figure 1A:
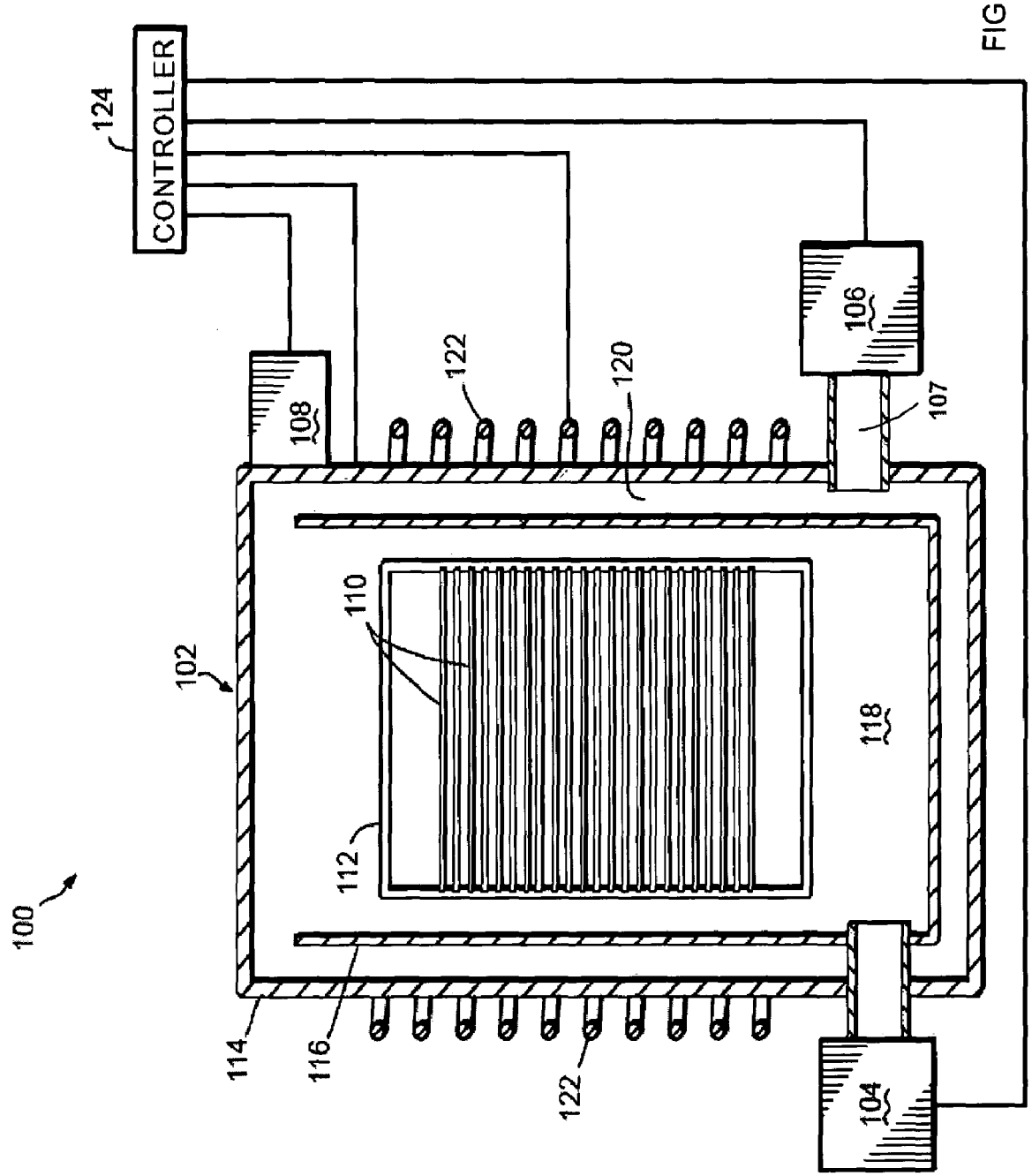
FIG. 1A is a simplified block diagram of a batch type processing system in accordance with one embodiment of the invention.

Referring now to the drawings, wherein like reference numerals designate identical or corresponding parts throughout the several views, and more particularly to FIG. 1A, FIG. 1A shows a simplified block diagram of a processing system according to an embodiment of the present invention. The batch type processing system 100 can, for example, be a thermal processing system, a plasma processing system capable of sustaining a plasma, a chemical vapor deposition processing system, or an atomic layer deposition system. As illustrated in FIG. 1A, the batch type processing system 100 includes a process chamber 102, a gas injection system 104, a heater 122, a vacuum pumping system 106, an exhaust connection 107 to the vacuum pumping system 106, a chamber monitoring system 108, and a controller 124. Multiple substrates 110 can be loaded into the process chamber 102 and processed using substrate holder 112. Furthermore, the process chamber 102 has an outer section 114 and an inner section 116. In one embodiment of the present invention, the inner section 116 includes a process tube.

The gas injection system 104 introduces gases into the process chamber 102 for a number of purposes including but not limited to purging the process chamber 102, preparing the process chamber 102, cleaning the process chamber 102, and processing the substrates 110. A plurality of gas injector lines can be arranged to flow gases into the process chamber 102. The gases can be introduced into volume 118, defined by the inner section 116, and exposed to substrates 110. Thereafter, the gases can flow into the volume 120, defined by the inner section 114 and the outer section 116, and exhausted from the process chamber 102 by the vacuum pumping system 106.

Substrates 110 can be loaded into the process chamber 102 and processed using substrate holder 112. The batch type processing system 100 can allow for a large number of tightly stacked substrates 110 to be processed, thereby resulting in high substrate throughput. A substrate batch size can, for example, be about 100 substrates (wafers), or less. Alternately, the batch size can be about 25 substrates, or less. The processing system 100 can be configured to process substrates of various sizes, for example 200 mm substrates, 300 mm substrates, or larger substrates. The substrates 110 can, for example, include semiconductor substrates (e.g., Si or compound semiconductor), LCD substrates, and glass substrates whose surfaces of which the deposition of hafnium oxide or hafnium silicate would be beneficial.

In one embodiment of the present invention, the batch type processing system 100 can be controlled by a controller 124 capable of generating control voltages sufficient to communicate and activate inputs of the batch type processing system 100 as well as monitor outputs from the batch type processing system 100. Moreover, the controller 124 can be coupled to and exchange information with process chamber 102, gas injection system 104, heater 122, chamber monitoring system 108, and vacuum pumping system 106. For example, a program stored in the memory of the controller 124 can be utilized to control the aforementioned components of the batch type processing system 100 according to a desired process, and to perform any functions associated with monitoring the process. One example of controller 124 is a DELL PRECISION WORKSTATION 610™, available from Dell Corporation, Dallas, Tex.

Real-time process monitoring can be carried out using chamber monitoring system 108. The chamber monitoring system 108 can be positioned to monitor the gaseous environment in the process chamber 102. Alternately, the chamber monitoring system 108 can be positioned to monitor the process chamber effluent. In general, the chamber monitoring system 108 is a versatile monitoring system and can, for example, include a mass sensor (mass spectrometer) or an optical monitoring system (e.g., a Fourier Transform Infrared (FTIR) spectrometer) for monitoring light absorption by a process gas and reaction by-products. The chamber monitoring system 108, which is a process monitoring system, can provide qualitative and quantitative analysis of the gaseous environment in the process chamber 102. Process parameters that can be monitored using the chamber monitoring system 108 include process gas flows, gas pressure, ratios of gaseous species, gas purities, and reaction by-products including etch products.

A mass sensor is a readily available instrument for detection, identification, and monitoring of a gaseous environment in a processing system. A mass sensor can offer extreme sensitivity for detecting trace amounts of gaseous substances. Due to the relatively high pressure at the process monitoring point of a typical process, the gas sampling can include a pressure reduction system. The pressure reduction can be carried out using a length of capillary tube or a throttle valve, and the mass sensor itself can be pumped continuously. Infrared spectroscopy is a well-established analytical method for measuring light absorption of gases and is ideal for semiconductor process monitoring, because it can be used in both vacuum or non-vacuum environments and can provide a wealth of valuable information during a process.

Figure 1B:
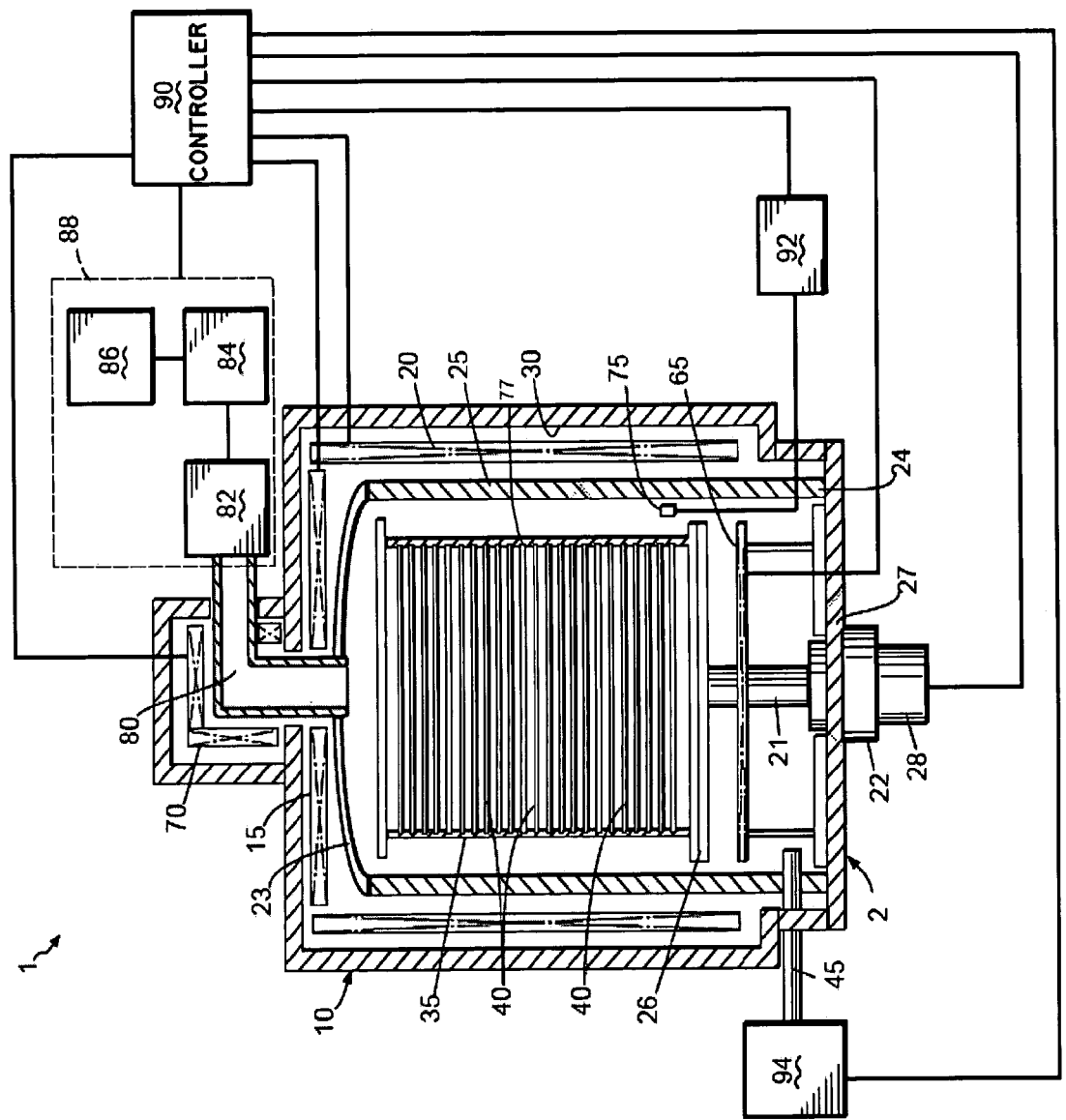
FIG. 1B is a simplified block diagram of another batch type processing system in accordance with one embodiment of the invention.

FIG. 1B shows a simplified block diagram of another processing system in accordance with one embodiment of the present invention. The batch type processing system 1 can, for example, be a thermal processing system or, alternately, the batch type processing system can be a plasma processing system capable of sustaining a plasma. The batch type processing system 1 contains a process chamber 10 and a process tube 25 that has an upper end 23 connected to an exhaust pipe 80, and a lower end 24 hermetically joined to a lid 27 of a cylindrical manifold 2, which includes those components of system 1 residing within the process tube 25 and removable therefrom, as well as the lid 27 and its operating components. The exhaust pipe or connection 80 discharges gases from the process tube 25 to a vacuum pumping system 88 to maintain a predetermined atmospheric or below atmospheric pressure in the processing system 1. A substrate holder 35 for holding a plurality of substrates (wafers) 40 in a tier-like manner (in respective horizontal planes at vertical intervals) is placed in the processing zone 77 of the process tube 25. The substrate holder 35 resides on a turntable 26 that is mounted on a rotatable shaft 21 penetrating the lid 27 and driven by a motor 28. The turntable 26 can be rotated during processing to improve overall film uniformity or, alternately, the turntable 26 can be stationary during processing. The lid 27 is mounted on an elevator 22 for transferring the substrate holder 35 in and out of the process tube 25. When the lid 27 is positioned at its uppermost position, as shown in FIG. 1B, the lid 27 is adapted to close the open end of the manifold 2.

The processing system 1 can further include a pedestal (not shown) to provide thermal insulation between the substrate holder 35 and the manifold 2. In addition, the processing system 1, can include a cap cover (not shown) to protect the lid 27 from the processing environment. The pedestal and cap cover can, for example, be made of quartz or SiC.

A plurality of gas injector lines 45 can be arranged around the manifold 2 to supply a plurality of gases into the process tube 25 through the gas injector lines 45. In FIG. 1B, only one gas injector line 45 among the plurality of gas injector lines is shown. The gas injector line 45 is connected to a gas injection system 94. The process chamber 10 typically has a mirror-finished inner surface 30 to suppress dissipation of radiation heat radiated by main heater 20, bottom heater 65, top heater 15, and exhaust pipe heater 70. A helical cooling water passage (not shown) can be formed within the wall of the process chamber 10 as a cooling medium passage.

A vacuum pumping system 88 typically includes a vacuum pump 86, a trap 84, and an automatic pressure controller (APC) 82. The vacuum pump 86 can, for example, include a dry vacuum pump capable of a pumping speed up to 20,000 liters per second (and greater). During processing, gases can be introduced into the process chamber 10 via the gas injection system 94 and the process pressure adjusted by the APC 82. The trap 84 can collect unreacted precursor material and by-products from the process chamber 10.

The chamber monitoring system 92 can be positioned to monitor the gaseous environment in the process chamber 10. Alternately, the chamber monitoring system 92 can be positioned to monitor the process chamber effluent. The chamber monitoring system 92 includes a sensor 75 capable of real-time process monitoring and can, for example, be a MS or a FTIR spectrometer. A controller 90 includes a microprocessor, a memory, and a digital I/O port capable of generating control voltages sufficient to communicate and activate inputs to the processing system 1 as well as monitor outputs from the processing system 1. Moreover, the controller 90 is coupled to and can exchange information with gas injection system 94, motor 28, chamber monitoring system 92, heaters 20, 15, 65, and 70, and vacuum pumping system 88.

It is to be understood that the processing systems in FIGS. 1A and 1B are for exemplary purposes only, as many variations of the specific hardware and software can be used to implement systems in which the present invention may be practiced, and these variations will be apparent to one having ordinary skill in the art.

The processing systems in FIGS. 1A and 1B may have system components that can erode, can become coated with material deposits, or can have a material deposit removed during processing. Consumable system components include process tubes, shields, rings, baffles, liners, and other system components found in batch type processing systems. In one embodiment of the present invention, the system components can be manufactured from a variety of materials that are transparent to light. The consumable system components can, for example, contain ceramic materials such as oxides, (e.g., quartz and alumina), nitrides (e.g., silicon nitride), carbides (e.g., silicon carbide). A system component can be constructed from a single type of material or, alternately, it can be constructed from more than one type of material.

Processing of substrates in a processing system can form a material deposit on the system components. In particular, the present invention relates to the need to restore system components that have been coated with hafnium-based dielectrics, such as for example hafnium oxide, hafnium silicate, or hafnium oxynitride. More specifically, after a furnace has been used for hafnium oxide, hafnium silicate or hafnium oxynitride depositions, and potentially other films such as polysilicon, dry cleaning in a fluorinated chemistry is typical. The cleaning process in general includes a process gas capable of removing a material deposit from a system component. A system component can contain quartz, and the process gas can, for example, contain a cleaning gas including a halogen-containing gas (e.g., $ClF_3$, $F_2$, $NF_3$ or HF, or a combination thereof). The process gas can further contain an inert gas selected from Ar, He, Ne, Kr, Xe, or $N_2$, or a combination thereof.

Monitoring of the cleaning process can be performed as described in U.S. patent application Ser. No. 10/673,513 entitled "METHOD FOR MONITORING STATUS OF SYSTEM COMPONENTS" described above. Such monitoring as described therein can further include determining if an intensity level of transmitted or reflected light from a system component has reached a threshold value, arriving at a determination of whether the system component has been sufficiently cleaned, and based on the determination, either continuing with the cleaning process or stopping the cleaning process.

In one embodiment of the present invention, the chamber temperature can be between about 50° C. and about 1100° C. during a system deposition, cleaning, conditioning, coating, or restoration. In one embodiment of the present invention, the chamber pressure can be between about 10 mTorr and about 760 Torr during a system deposition, cleaning, conditioning, coating, or restoration. In yet another embodiment of the present invention, the system components can be made of quartz, and a chamber cleaning process can heat a chamber to a temperature from 50-1100° C. and can provide a chamber pressure of about 10 mTorr to 760 Torr utilizing the above-listed fluorine-based etchants. In one non-limiting illustrative example of a hafnium silicate dry clean, the furnace of the chamber is heated to 600° C., maintained at a pressure of 150 Torr under a flow rate of 3 slm of HF and 8 slm of $N_2$. In another non-limiting illustrative example of a polysilicon dry cleaning process, the furnace of the chamber is heated to 300° C., maintained at a pressure of 150 Torr under a flow rate of 10 slm of fluorine gas (delivered as a 3-20% concentration of fluorine in $N_2$).

In one embodiment of the present invention, a processing system can include a system component having a protective coating to increase the longevity of the processing system. A protective coating can, for example, protect a consumable system component from the processing environment during the fluorinated etch process, and increase the lifetime of the system components. Further, the process gas can contain a chamber conditioning gas for conditioning a chamber, for example a silicon-containing gas such as dichlorosilane (DCS) and a nitrogen-containing gas such as $NH_3$, to form a silicon nitride coating on a system component to passivate and/or prevent contaminant outgassing. Alternatively, a film formation gas for forming a film on a substrate, for example a nitrogen-containing gas such NO or $N_2O$ or a combination thereof for forming an oxide film or an oxynitride film on a substrate, a silicon-containing gas such as for example tetraethyl orthosilicate (TEOS) for depositing $SiO_2$ on substrate, or a metal-containing gas for forming a metal-oxide film (e.g., hafnium oxide) on a substrate; or a substrate etch gas for removing material from a substrate, for example a halogen-containing gas such HF for $SiO_2$ film removal all can be used. Currently, furnace chambers are coated using a deposited oxide material such as bis(tertiary butylamino) silane (BT-BAS) oxide or tetraethylorthosilicate (TEOS). Both of these furnace chamber coatings are deposition materials that utilize non-chlorinated, organic carriers and accordingly produce non-chlorinated, organic by-products that add deposition materials to the vacuum system foreline (e.g., exhaust connections 107 and 80 shown in FIGS. 1A and 1B).

Utilization of conditioning and coating processes does not offset the need to clean the processing system of excess hafnium oxide, hafnium silicate, or hafnium oxynitride deposits, and specifically does not address the issue of hafnium fluoride residues occurring after exposing parts of the processing system to fluorinated chemical etch species.

Processing aggressive reactants such as fluorine or the above noted HF gas requires initially substantial investment in safety and equipment precautions. Even the processing of seemingly less aggressive etchants such as $CF_4$ and $O_2$, which, while benign as gas sources, inside the processing system, can produce $CO_2$ and fluorine, the latter of which presents the same problems in gas pumping, exhausting, and neutralization as using fluorine or HF presented. Typically, stainless steel and nickel based metallic vacuum components are used in order to form a stable nickel fluoride resistant to continued fluorine attack. Typically, expensive synthetic pump oils are used to withstand viscosity breakdown of hydrocarbon-based oils. Typically, the exhaust gas from the processing system has to be water scrubbed and neutralized, before disposal. All these steps contribute to the complexity and costs when fluorinated etchants are utilized. This overhead investment is frustrated when a processing system compatible with fluorine chemistry subsequently produces particulate problems, costing yield in the hafnium oxide, hafnium silicate, or hafnium oxynitride transistor gate oxide and risking loss of the capital investment in the processing system.

The present invention recognizes that transport of the fluorine-reacted hafnium products from the process chamber can, due to condensation on the cooler parts of the process chamber and due to condensation on the walls of the vacuum pumping system, lead to the undesirable accumulation of hafnium-fluoride residue, such as for example $HfF_x$, where x can vary from 1 to 4, responsible in part for the above-noted particulate problem.

Accordingly, in one embodiment of the present invention, there is provided a method for cleaning the hafnium fluoride by-products from the pumping system components by introduction of a chlorine-generating gas source. Chlorine reacts with the hafnium fluoride by-products to form chlorinated hafnium products that are more volatile than hafnium fluoride permitting (1) reduction of the hafnium fluoride by-products and (2) expulsion of the potential particulate sources from the processing system. Typical, chlorine sources can include chlorinated silicon and chlorinated carbon carriers. Chlorine carriers suitable for the present invention include, but are not limited to silicon tetrachloride ($SiCl_4$), $Cl_2$, and HCl. As such, the present invention in one embodiment utilizes dichlorosilane (DCS) as a chlorine source and $N_2O$ or NO, or a combination thereof, as an oxygen source. The ratio of the oxygen source gas to DCS establishes the rate of chlorine made available to the gas phase.

In one embodiment of the present invention, it is recognized that a $SiO_2$ deposition is often desired after dry cleaning to remove surface defects in the processing system and thereby re-establish quartz surfaces in the processing system. Restoration of these surfaces can prevent the development of particulates in subsequent processing. Hence, there is provided in one embodiment of the present invention a method for cleaning the hafnium fluoride by-product while at the same time coating the processing system walls (such as for example a quartz furnace wall) with $SiO_2$. According to this embodiment, by depositing $SiO_2$ from a chlorinated Si source such as for example DCS and an oxygen source, such as for example $N_2O$, the chlorine by-product discussed above can react with the hafnium fluoride to reduce the content of hafnium fluoride on parts of the processing system including parts of the pumping system including the foreline connections to the pump, while at the same time $SiO_2$ deposition occurs on the processing system walls.

In the example of DCS with $N_2O$, the process requires a relatively high temperature, ~800° C., and a relatively long time (due to relatively slow deposition rate), so that there is a significant presence of thermally active chlorine by-product over a significant time for cleaning of the processing system including the vacuum pumping foreline components. For quartz fixtures in the processing system, prolonged exposure to chlorine-based reactants does not excessively etch these surfaces.

In the example of $SiO_2$ deposition using DCS and $N_2O$, a typical process operates at 800° C. which supplies significant thermal energy for chlorine formation and reaction, and the deposition rate of $SiO_2$ is about 3 angstrom(Å)/min, which provides significant exposure time of by-product chlorine species in the vacuum foreline to clean, while an adequate thickness of $SiO_2$ (typically 100-5000 Å) is deposited in the furnace chamber.

In one non-limiting illustrative example of hafnium fluoride residue removal process that produces simultaneously a protective silicon oxide, the furnace is operated at 780° C. at a pressure of 350 mTorr under a flowrate of $N_2O$ at 0.3 slm and a flowrate of DCS at 0.15 slm to produce in over 4 hrs an oxide of 15-100 Å.

As such, in one embodiment of the invention, the cleaning method coats the walls and system components of the processing system with $SiO_2$ while the by-product species of the cleaning method clean the walls and system components of the processing system of hafnium fluoride and other particulate by-products from previous depositions. In other words, the chamber-coating $SiO_2$ process coincidentally generates chlorinated by-products that will help clean the walls and system components of the processing system including the vacuum foreline of hafnium fluoride by-product accumulation. As such, the deposition/coating chemistries in one embodiment of the present invention both coats the chamber and provides a hafnium fluoride removal mechanism for removal of hafnium fluoride and other particulate by-products from the processing system and vacuum system foreline.

Figure 2:
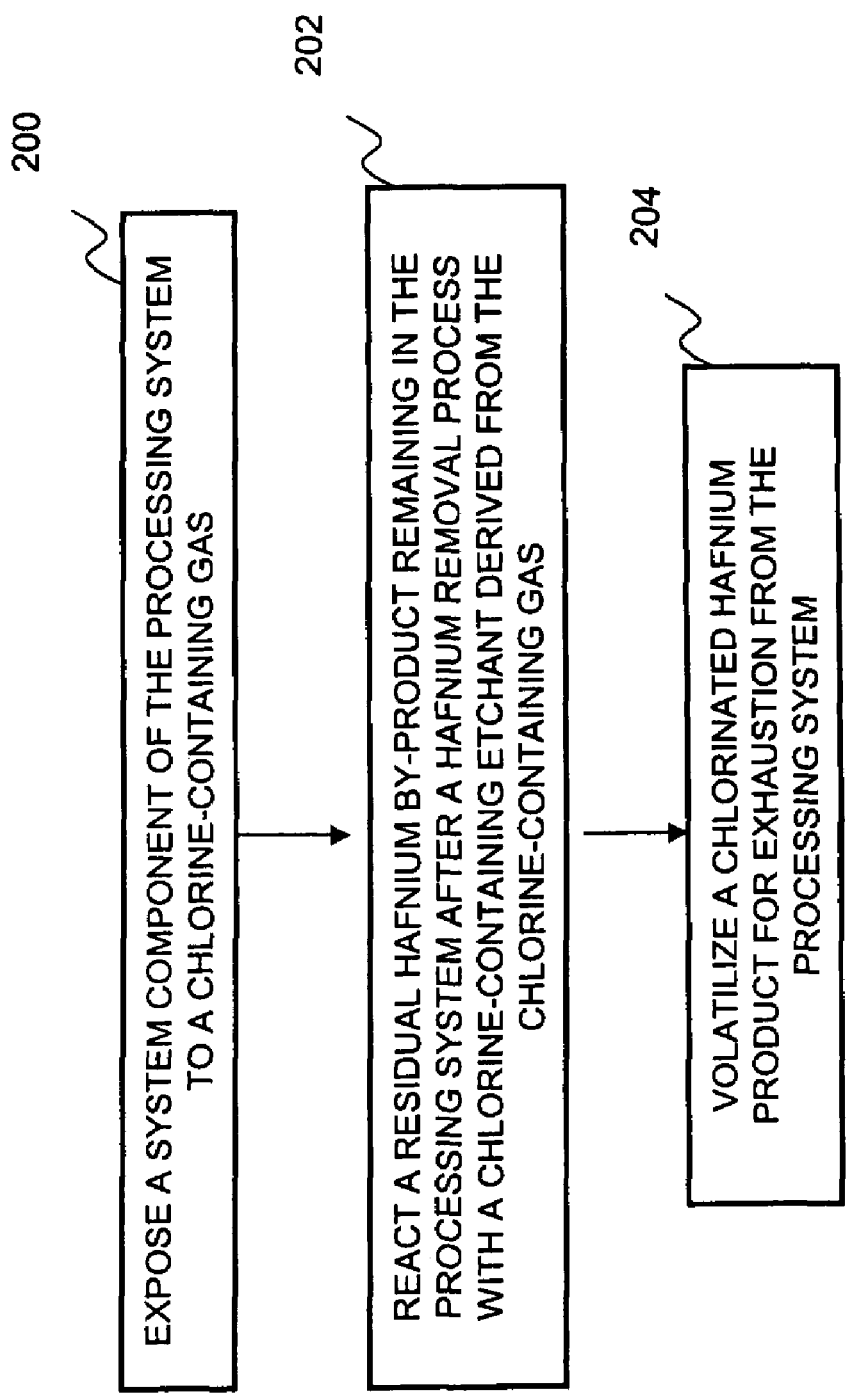
FIG. 2 is a flowchart depicting one exemplary method of the present invention.

FIG. 2 is a flowchart depicting one exemplary method of the present invention for treating a processing system. As shown illustratively in FIG. 2, at step 200, a system component of the processing system is exposed to a chlorine-containing gas. At step 202, a residual hafnium by-product remaining in the processing system after a hafnium removal process is reacted with a chlorine-containing etchant derived from the chlorine-containing gas. At step 204, a chlorinated hafnium product is volatilized for exhaustion from the processing system.

Step 200 can expose a number of the processing system parts including by way of illustration a process tube, a shield, a ring, a baffle, and/or a liner of a furnace to the chlorine-containing etchant, or other parts and combinations of these parts. Step 200 can include introducing as the chlorine-containing gas a chlorinated silane, a partially fluorinated silane, or a partially organic silane, or a combination of two or more thereof. Step 202 can provide a chlorinated silane and an oxygen-containing gas to the processing system. The oxygen-containing gas can include $O_2$, $N_2O$, or NO, or a combination of two or more thereof. Step 202 can perform thermal process or a plasma process in the processing system to produce the chlorine-containing etchant.

Additionally, a chamber cleaning process and a chamber coating process can be performed, as needed, to treat the walls of the processing system. The chamber cleaning process can introduce a process gas including a halogen-containing gas during the chamber cleaning process such as for example $ClF_3$, $F_2$, $NF_3$, or HF, or a combination of two or more thereof. These gases can be utilized to remove accumulated hafnium silicate, hafnium oxide, or hafnium oxynitride from the processing system. The chamber cleaning process can introduce a chlorinated silane (including for example dichlorosilane) and can introduce $O_2$, $N_2O$, or NO, or a combination of two or more thereof, during the chamber cleaning process to remove accumulated hafnium fluorides from the processing system.

The chamber coating process can introduce a process gas including at least one of silicon-containing gas and an oxygen-containing gas, such as for example a combination of dichlorinated silane and $O_2$, $N_2O$, or NO, or a combination of two or more thereof, or alternatively can introduce $SiH_4$ or $Si_2H_6$, or a combination thereof, and $O_2$, $N_2O$, or NO, or a combination of two or more thereof. The chamber cleaning process and the chamber coating process can be performed in a simultaneous process such as when dichlorinated silane and $O_2$, $N_2O$, or NO, or a combination of two or more thereof, at are introduced with an atomic ratio of silicon to oxygen that typically but not necessarily is greater than two. The $SiO_2$ coating deposition can be applied after a hafnium silicate, hafnium oxide, or hafnium oxynitride dry clean and hafnium fluoride removal, or just after a hafnium silicate, hafnium oxide, or hafnium oxynitride dry clean.

At step 202, the chlorine-containing source gas can be reacted on parts of the processing system at a temperature between 50° C. and 1100° C. At step 202, the residual hafnium by-product can be reacted with the chlorine-containing etchant by exposing parts of the processing system to a pressure of the chlorine-containing etchant between 1 mTorr and about 1000 Torr. The partial pressure of the chlorine-containing etchant can be adjusted by introducing an inert gas including Ar, He, Ne, Kr, Xe, or $N_2$, or a combination of two or more thereof, into the processing system during this step. As such, a residual hafnium by-product of the hafnium silicate, hafnium oxide, or hafnium oxynitride removal process such as for example hafnium fluoride can be reacted with the chlorine-containing etchant. In an illustrative example of step 202, a part of the processing system can be exposed to a pressure from 100 mTorr to 500 mTorr of the chlorine-containing etchant and to a temperature from 200° C. to 400° C. to dissolve the residual hafnium fluoride in the processing system. Additionally, at step 202, Cl, $Cl_2$, or HCl, or a combination of two or more thereof, can be admitted to the processing system to expose the residual hafnium by-product to such additional chlorine-containing etchants.

In one aspect of the present invention, $ClF_3$, $F_2$, $NF_3$, or HF, or a combination of two or more thereof, can be introduced to the processing system as a fluorine etchant at which time by-product gasses can be monitored for dissolution of the hafnium silicate, hafnium oxide, or hafnium oxynitride from the processing system. Typically, either the decrease in by-products or increase in an etchant material (as the etching reaches completion) can be detected by RGA and/or FTIR. During introduction of the fluorine etchant, a process tube, a shield, a ring, a baffle, an inner liner, an outer liner, and/or an exhaust connection of the processing system, as well as other parts in the processing system, can be exposed to the fluorine etchant.

In turn, during step 204, by-product gasses from the processing system for the chlorine etch of hafnium fluoride can be monitored for presence of the chlorine-containing etchant. During the volatilizing of step 204, system components can be heated for example from 100° C. to 800° C. An inert gas purge or evacuation can be used during this step to remove the volatilized components.

Further, the processing system treatment of the present invention can be automated using the controllers shown in FIGS. 1A and 1B. As for the controllers of FIGS. 1A and 1B, the controller 370 may be implemented as a DELL PRECISION WORKSTATION 610™. Moreover, the controller of any of FIGS. 1A, and 1B may be implemented as a general purpose computer system such as that described with respect to FIG. 3.

Figure 3:
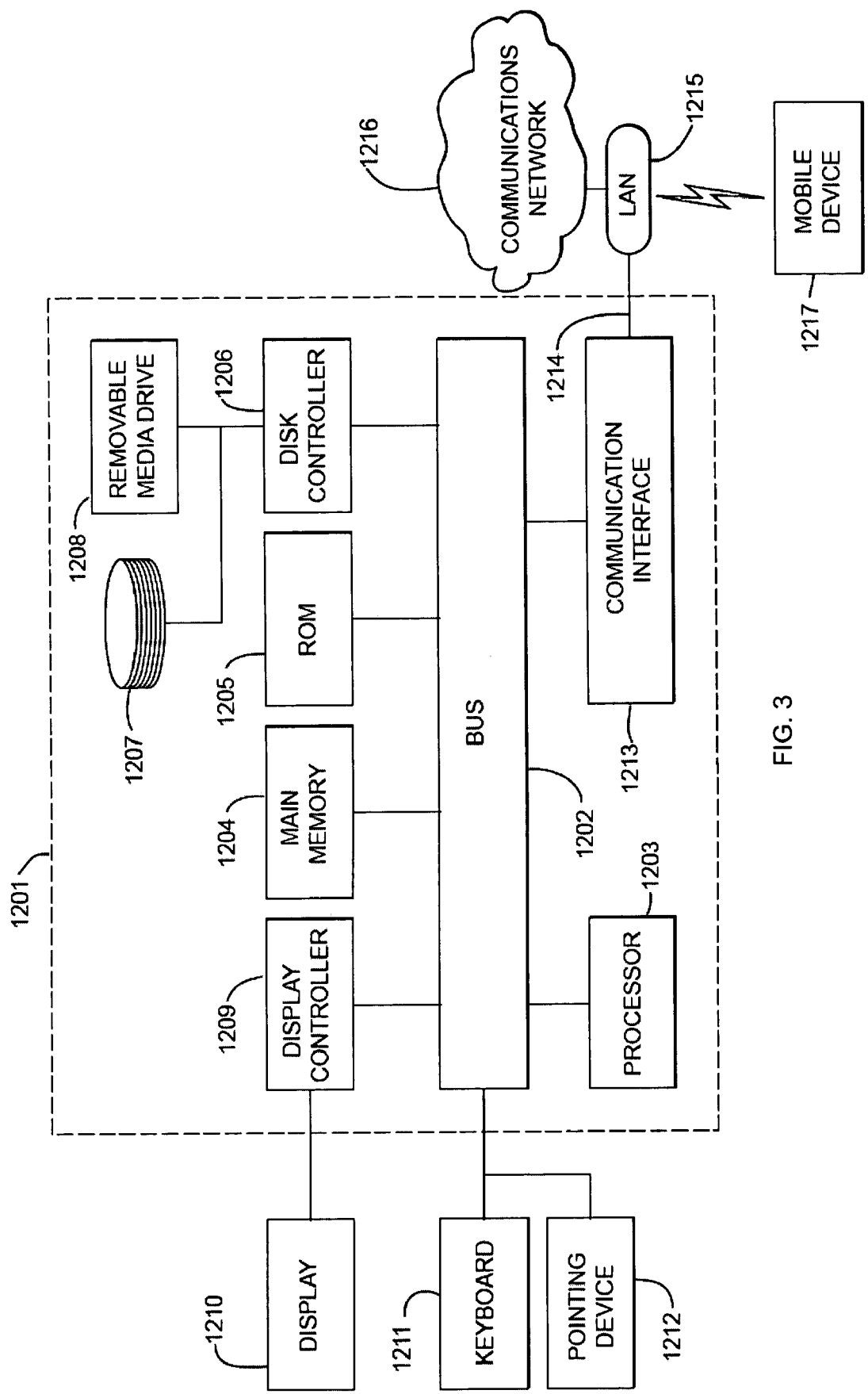
FIG. 3 is a schematic diagram illustrating a computer system for implementing various embodiments of the present invention.

FIG. 3 illustrates a computer system 1201 upon which an embodiment of the present invention may be implemented. The computer system 1201 may be used as the controller of FIG. 1A or 1B or a similar controller. The computer system 1201 includes a bus 1202 or other communication mechanism for communicating information, and a processor 1203 coupled with the bus 1202 for processing the information. The computer system 1201 also includes a main memory 1204, such as a random access memory (RAM) or other dynamic storage device (e.g., dynamic RAM (DRAM), static RAM (SRAM), and synchronous DRAM (SDRAM)), coupled to the bus 1202 for storing information and instructions to be executed by processor 1203. In addition, the main memory 1204 may be used for storing temporary variables or other intermediate information during the execution of instructions by the processor 1203. The computer system 1201 further includes a read only memory (ROM) 1205 or other static storage device (e.g., programmable ROM (PROM), erasable PROM (EPROM), and electrically erasable PROM (EEPROM)) coupled to the bus 1202 for storing static information and instructions for the processor 1203.

The computer system 1201 also includes a disk controller 1206 coupled to the bus 1202 to control one or more storage devices for storing information and instructions, such as a magnetic hard disk 1207, and a removable media drive 1208 (e.g., floppy disk drive, read-only compact disc drive, read/write compact disc drive, compact disc jukebox, tape drive, and removable magneto-optical drive). The storage devices may be added to the computer system 1201 using an appropriate device interface (e.g., small computer system interface (SCSI), integrated device electronics (IDE), enhanced-IDE (E-IDE), direct memory access (DMA), or ultra-DMA).

The computer system 1201 may also include special purpose logic devices (e.g., application specific integrated circuits (ASICs)) or configurable logic devices (e.g., simple programmable logic devices (SPLDs), complex programmable logic devices (CPLDs), and field programmable gate arrays (FPGAs)). The computer system may also include one or more digital signal processors (DSPs) such as the TMS320 series of chips from Texas Instruments, the DSP56000, DSP56100, DSP56300, DSP56600, and DSP96000 series of chips from Motorola, the DSP1600 and DSP3200 series from Lucent Technologies or the ADSP2100 and ADSP21000 series from Analog Devices. Other processors especially designed to process analog signals that have been converted to the digital domain may also be used. The computer system may also include one or more digital signal processors (DSPs) such as the TMS320 series of chips from Texas Instruments, the DSP56000, DSP56100, DSP56300, DSP56600, and DSP96000 series of chips from Motorola, the DSP1600 and DSP3200 series from Lucent Technologies or the ADSP2100 and ADSP21000 series from Analog Devices. Other processors specially designed to process analog signals that have been converted to the digital domain may also be used.

The computer system 1201 may also include a display controller 1209 coupled to the bus 1202 to control a display 1210, such as a cathode ray tube (CRT), for displaying information to a computer user. The computer system includes input devices, such as a keyboard 1211 and a pointing device 1212, for interacting with a computer user and providing information to the processor 1203. The pointing device 1212, for example, may be a mouse, a trackball, or a pointing stick for communicating direction information and command selections to the processor 1203 and for controlling cursor movement on the display 1210. In addition, a printer may provide printed listings of data stored and/or generated by the computer system 1201.

The computer system 1201 performs a portion or all of the processing steps of the invention in response to the processor 1203 executing one or more sequences of one or more instructions contained in a memory, such as the main memory 1204. Such instructions may be read into the main memory 1204 from another computer readable medium, such as a hard disk 1207 or a removable media drive 1208. One or more processors in a multi-processing arrangement may also be employed to execute the sequences of instructions contained in main memory 1204. In alternative embodiments, hard-wired circuitry may be used in place of or in combination with software instructions. Thus, embodiments are not limited to any specific combination of hardware circuitry and software.

As stated above, the computer system 1201 includes at least one computer readable medium or memory for holding instructions programmed according to the teachings of the invention and for containing data structures, tables, records, or other data described herein. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave (described below), or any other medium from which a computer can read.

Stored on any one or on a combination of computer readable media, the present invention includes software for controlling the computer system 1201, for driving a device or devices for implementing the invention, and for enabling the computer system 1201 to interact with a human user (e.g., print production personnel). Such software may include, but is not limited to, device drivers, operating systems, development tools, and applications software. Such computer readable media further includes the computer program product of the present invention for performing all or a portion (if processing is distributed) of the processing performed in implementing the invention.

The computer code devices of the present invention may be any interpretable or executable code mechanism, including but not limited to scripts, interpretable programs, dynamic link libraries (DLLs), Java classes, and complete executable programs. Moreover, parts of the processing of the present invention may be distributed for better performance, reliability, and/or cost.

The term "computer readable medium" as used herein refers to any medium that participates in providing instructions to the processor 1203 for execution. A computer readable medium may take many forms, including but not limited to, non-volatile media, volatile media, and transmission media. Non-volatile media includes, for example, optical, magnetic disks, and magneto-optical disks, such as the hard disk 1207 or the removable media drive 1208. Volatile media includes dynamic memory, such as the main memory 1204. Transmission media includes coaxial cables, copper wire and fiber optics, including the wires that make up the bus 1202. Transmission media also may also take the form of acoustic or light waves, such as those generated during radio wave and infrared data communications.

Various forms of computer readable media may be involved in carrying out one or more sequences of one or more instructions to processor 1203 for execution. For example, the instructions may initially be carried on a magnetic disk of a remote computer. The remote computer can load the instructions for implementing all or a portion of the present invention remotely into a dynamic memory and send the instructions over a telephone line using a modem. A modem local to the computer system 1201 may receive the data on the telephone line and use an infrared transmitter to convert the data to an infrared signal. An infrared detector coupled to the bus 1202 can receive the data carried in the infrared signal and place the data on the bus 1202. The bus 1202 carries the data to the main memory 1204, from which the processor 1203 retrieves and executes the instructions. The instructions received by the main memory 1204 may optionally be stored on storage device 1207 or 1208 either before or after execution by processor 1203.

The computer system 1201 also includes a communication interface 1213 coupled to the bus 1202. The communication interface 1213 provides a two-way data communication coupling to a network link 1214 that is connected to, for example, a local area network (LAN) 1215, or to another communications network 1216 such as the Internet. For example, the communication interface 1213 may be a network interface card to attach to any packet switched LAN. As another example, the communication interface 1213 may be an asymmetrical digital subscriber line (ADSL) card, an integrated services digital network (ISDN) card or a modem to provide a data communication connection to a corresponding type of communications line. Wireless links may also be implemented. In any such implementation, the communication interface 1213 sends and receives electrical, electromagnetic or optical signals that carry digital data streams representing various types of information.

The network link 1214 typically provides data communication through one or more networks to other data devices. For example, the network link 1214 may provide a connection to another computer through a local network 1215 (e.g., a LAN) or through equipment operated by a service provider, which provides communication services through a communications network 1216. The local network 1214 and the communications network 1216 use, for example, electrical, electromagnetic, or optical signals that carry digital data streams, and the associated physical layer (e.g., CAT 5 cable, coaxial cable, optical fiber, etc). The signals through the various networks and the signals on the network link 1214 and through the communication interface 1213, which carry the digital data to and from the computer system 1201 may be implemented in baseband signals, or carrier wave based signals. The baseband signals convey the digital data as unmodulated electrical pulses that are descriptive of a stream of digital data bits, where the term "bits" is to be construed broadly to mean symbol, where each symbol conveys at least one or more information bits. The digital data may also be used to modulate a carrier wave, such as with amplitude, phase and/or frequency shift keyed signals that are propagated over a conductive media, or transmitted as electromagnetic waves through a propagation medium. Thus, the digital data may be sent as unmodulated baseband data through a "wired" communication channel and/or sent within a predetermined frequency band, different than baseband, by modulating a carrier wave. The computer system 1201 can transmit and receive data, including program code, through the network(s) 1215 and 1216, the network link 1214, and the communication interface 1213. Moreover, the network link 1214 may provide a connection through a LAN 1215 to a mobile device 1217 such as a personal digital assistant (PDA) laptop computer, or cellular telephone.

Figure 4:
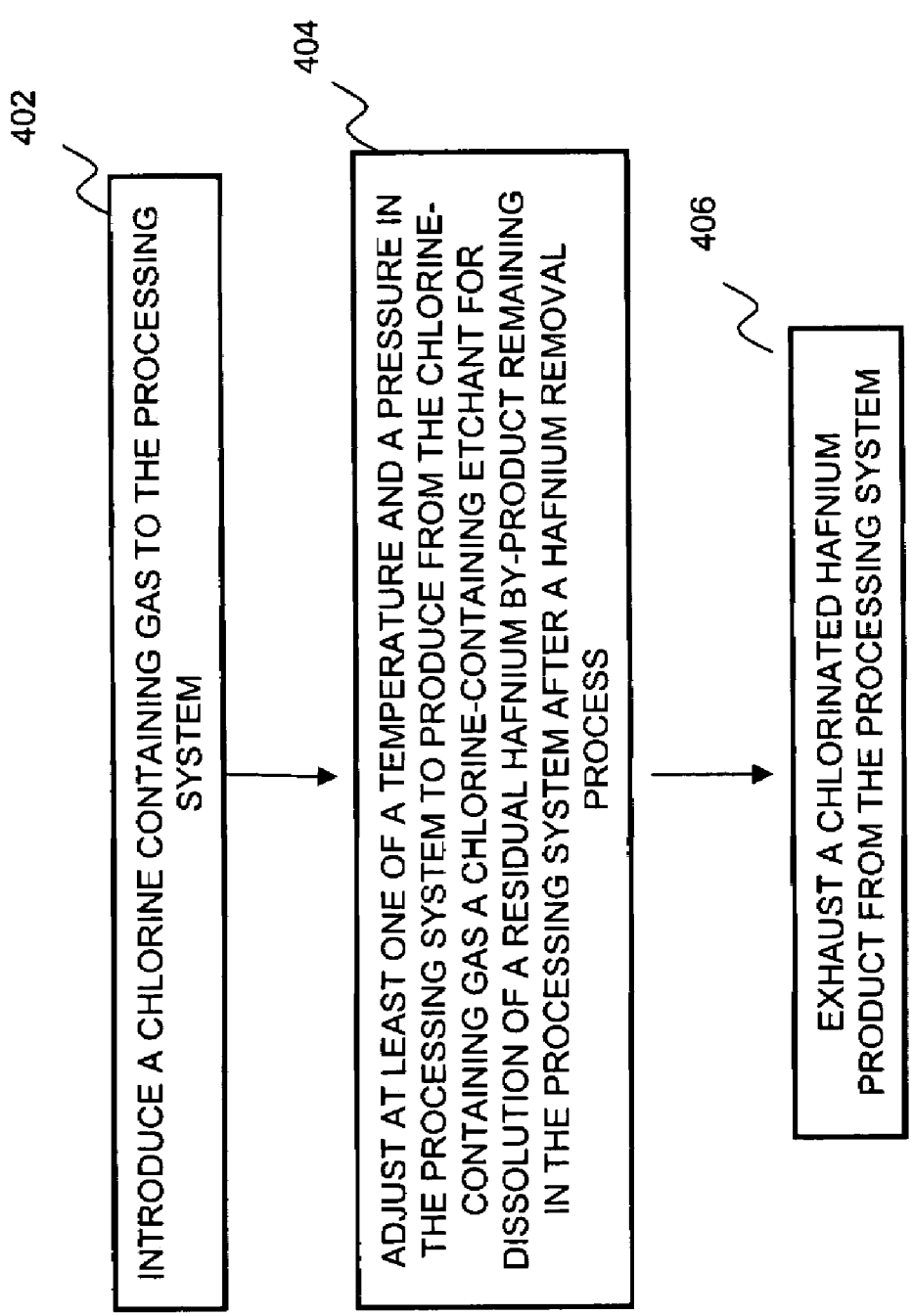
FIG. 4 is a flowchart depicting one exemplary computer-implemented method of the present invention.

Accordingly, the controllers of the present invention can be programmed such that the processing system can perform the following steps depicted in illustrative flowchart FIG. 4:

Step 402 introduces a chlorine-containing gas to the processing system,

Step 404 adjusts at least one of a temperature and a pressure in the processing system to produce from the chlorine-containing gas a chlorine-containing etchant for dissolution of a residual hafnium by-product remaining in the processing system after a hafnium removal process (such as for example removal by a fluorine etchant of hafnium oxide, hafnium silicate, and/or hafnium oxynitride), and Step 406 exhausts a chlorinated hafnium product from the processing system.

According to one embodiment of the present invention, Step 402 can control a flowrate of a chlorinated silane including a partially-fluorinated silane and a partially organic silane. Step 402 can control flowrates of a chlorinated silane and an oxygen-containing gas to the processing system to produce the chlorine-containing etchant. Steps 402 and 404 can control a flowrate of $O_2$, $N_2O$, or NO, or a combination of two or more thereof, into the processing system as the oxygen-containing gas.

Further, the controllers of FIGS. 1A and 1B of the present invention can be programmed to perform at least one of a thermal process and a plasma process in the processing system to produce the chlorine-containing etchant. The controllers can be programmed to perform a chamber cleaning process and/or a chamber coating process. As such, the controllers can be programmed to control (1) a flow rate of a process gas including a halogen-containing gas during the chamber cleaning process, (2) a flow rate of $ClF_3$, $F_2$, $NF_3$, or HF, or a combination of two or more thereof, during the chamber cleaning process to remove accumulated hafnium silicate, hafnium oxide, or hafnium oxynitride from the processing system, and/or (3) a flow rate of a chlorinated silane (including for example dichlorosilane) and $O_2$, $N_2O$, or NO, or a combination of two or more thereof, during a chamber cleaning process to produce the chlorine-containing etchant for removal of the residual hafnium by-product.

According to one embodiment of the present invention, the controllers can be programmed to control a flow rate of silicon-containing gas or an oxygen-containing gas, or a combination thereof, during the chamber coating process. For example, the controllers can be programmed to control a flow rate of dichlorosilane and $O_2$, $N_2O$, or NO, or a combination of two or more thereof, to produce a silicon dioxide coating on a part of the processing system and/or to control a flow rate of $SiH_4$ or $Si_2H_6$, or a combination thereof along with a flow rate of $O_2$, $N_2O$, or NO, or a combination of two or more thereof, to produce a silicon dioxide coating on a part of the processing system. In the former process, the controller can be programmed to perform the chamber cleaning process and the chamber coating process in a simultaneous process by controlling a flowrate of dichlorosilane and controlling a flowrate of $O_2$, $N_2O$, or NO, or a combination of two or more thereof, at an atomic ratio of silicon to oxygen that is preferably, but not necessarily, greater than two.

According to one embodiment of the present invention, during step 404, the controller can be programmed to heat a part of the processing system to a temperature between 50° C. and 1100° C. to react the chlorine-containing gas. The controller can be programmed to control a flowrate of the chlorine-containing gas and to set a pressure of the chlorine-containing gas in the processing system between 1 mTorr and about 1000 Torr. The controller can be programmed to control a flowrate of an inert gas including Ar, He, Ne, Kr, Xe, and $N_2$, or a combination of two or more thereof, along with the flowrate of the chlorine-containing gas. The controller can be programmed to control a flowrate of an oxygen containing gas including NO, $O_2$, or $N_2O$, or a combination of two or more thereof, along with the flowrate of the chlorine-containing gas.

During step 404, the controller can be programmed to control a flowrate of Cl, $Cl_2$, and HCl, or a combination of two or more thereof, being supplied to the processing system for removal of the hafnium fluoride by-products. As such, the controller can be programmed to monitor by-product gasses for dissolution of hafnium silicate, hafnium oxide, or hafnium oxynitride from the processing system and to monitor by-product gasses for the chlorine-containing etchant during the exhausting step.

During step 404, the controller can be programmed to exhaust a chlorinated hafnium product from the processing system by heating system components of the processing system during the exhausting step to a range from 100° C. to 800° C., by purging the processing system during the heating step with Ar, He, Ne, Kr, Xe, or $N_2$, or a combination of two or more thereof, and/or by evacuating the processing system during the heating step.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

The invention claimed is:

1. A method for treating a hafnium-based dielectric processing system, comprising:
    exposing a system component of the processing system to a chlorine-containing gas;
    reacting a residual hafnium by-product remaining in the processing system after a hafnium removal process with a chlorine-containing etchant derived from the chlorine-containing gas;
    volatilizing a chlorinated hafnium product for exhaustion from the processing system;
    exposing the system component of the processing system to a pressure of the chlorine-containing etchant between 1 mTorr and about 1000 Torr; and introducing a silicon-containing gas and an oxygen-containing gas including NO, $O_2$, or $N_2O$, or a combination of two or more thereof, into the processing system.

2. The method according to claim 1, wherein the exposing comprises:
introducing as the chlorine-containing gas a chlorinated silane, a partially fluorinated silane, or a partially organic silane, or a combination of two or more thereof.

3. The method according to claim 1, wherein the reacting comprises:
providing a chlorinated silane and an oxygen-containing gas to the processing system.

4. A method for treating a hafnium-based dielectric processing system, comprising:
exposing a system component of the processing system to a chlorine-containing gas;
reacting a residual hafnium by-product remaining in the processing system after a hafnium removal process with a chlorine-containing etchant derived from the chlorine-containing gas;
volatilizing a chlorinated hafnium product for exhaustion from the processing system; and
providing a chlorinated silane and an oxygen-containing gas to the processing system wherein the providing an oxygen-containing gas comprises:
flowing $O_2$, $N_2O$, or NO, or a combination of two or more thereof, into the processing system.

5. The method according to claim 1, wherein the reacting comprises:
performing a thermal process or a plasma process, or a combination thereof, in the processing system to produce the chlorine-containing etchant.

6. The method according to claim 1, further comprising:
performing a chamber cleaning process or a chamber coating process, or a combination thereof.

7. The method according to claim 6, wherein the chamber cleaning process comprises:
introducing a process gas including a halogen-containing gas during the chamber cleaning process.

8. The method according to claim 7, further comprising:
introducing $ClF_3$, $F_2$, $NF_3$, or HF, or a combination of two or more thereof, during the chamber cleaning process to remove accumulated hafnium oxide, hafnium silicate, or hafnium oxynitride from the processing system.

9. The method according to claim 8, further comprising:
introducing a chlorinated silane and $O_2$, $N_2O$, or NO, or a combination of two or more thereof during the chamber cleaning process to remove accumulated hafnium fluorides from the processing system.

10. The method according to claim 9, wherein the introducing a chlorinated silane comprises:
admitting dichlorosilane to the processing system.

11. The method according to claim 6, wherein the chamber coating process comprises:
introducing the process gas including a silicon-containing gas and an oxygen-containing gas.

12. The method according to claim 11, wherein the introducing a process gas comprises:
admitting dichlorinated silane and $O_2$, $N_2O$, or NO, or a combination of two or more thereof, to the processing system.

13. The method according to claim 11, wherein the introducing a process gas comprises:
admitting $SiH_4$ or $Si_2H_6$, or a combination thereof, and admitting $O_2$, $N_2O$, or NO, or a combination of two or more thereof.

14. The method according to claim 6, further comprising:
performing said chamber cleaning process and said chamber coating process in a simultaneous process.

15. A method for treating a hafnium-based dielectric processing system, comprising:
exposing a system component of the processing system to a chlorine-containing gas;
reacting a residual hafnium by-product remaining in the processing system after a hafnium removal process with a chlorine-containing etchant derived from the chlorine-containing gas;
volatilizing a chlorinated hafnium product for exhaustion from the processing system;
performing a chamber cleaning process and a chamber coating process in a simultaneous process; and
introducing dichlorinated silane and $O_2$, $N_2O$, or NO, or a combination of two or more thereof, at an atomic ratio of silicon to oxygen that is greater than two.

16. The method according to claim 1, wherein the reacting comprises:
heating the system component of the processing system to a temperature between 50° C. and 1100° C.

17. The method according to claim 1, further comprising:
introducing an inert gas including Ar, He, Ne, Kr, Xe, or $N_2$, or a combination of two or more thereof, into the processing system.

18. The method according to claim 1, wherein the reacting comprises:
reacting hafnium fluoride with the chlorine-containing etchant.

19. The method according to claim 1, further comprising:
admitting $Cl_2$ or HCl, or a combination thereof, to the processing system.

20. The method according to claim 1, wherein the reacting comprises:
exposing the system component of the processing system to a pressure from 100 mTorr to 500 mTorr of the chlorine-containing etchant and to a temperature from 200° C. to 400° C. to dissolve the residual hafnium by-product.

21. The method according to claim 1, wherein the reacting comprises:
exposing in the processing system a process tube, a shield, a ring, a baffle, an inner liner, an outer liner, or an exhaust connection, or a combination of two or more thereof to the chlorine-containing etchant.

22. The method according to claim 1, further comprising:
introducing a fluorine etchant including $ClF_3$, $F_2$, $NF_3$, or HF, or a combination of two or more thereof, to the processing system for dissolution of hafnium oxide, hafnium silicate, or hafnium oxynitride from the processing system.

23. The method according to claim 22, wherein the introducing comprises:
exposing in the processing system a process tube, a shield, a ring, a baffle, an inner liner, an outer liner, or an exhaust connection, or a combination of two or more thereof, to the fluorine etchant.

24. The method according to claim 1, wherein the volatilizing comprises:
heating the system component to 100° C. to 800° C.

25. The method according to claim 24, further comprising:
evacuating the processing system.

26. The method according to claim 24, further comprising:
purging the processing system with Ar, He, Ne, Kr, Xe, or $N_2$, or a combination of two or more thereof.

* * * * *